United States Patent [19]

Yamazaki et al.

[11] Patent Number: 4,732,702

[45] Date of Patent: Mar. 22, 1988

[54] ELECTROCONDUCTIVE RESIN PASTE

[75] Inventors: Mitsuo Yamazaki; Iwao Maekawa, both of Hitachi, Japan

[73] Assignee: Hitachi Chemical Company, Ltd., Tokyo, Japan

[21] Appl. No.: 5,488

[22] Filed: Jan. 20, 1987

[30] Foreign Application Priority Data

Feb. 13, 1986 [JP] Japan .................. 61-29782

[51] Int. Cl.$^4$ ............................................. H01B 1/06
[52] U.S. Cl. .................... 252/512; 252/514; 252/518; 524/430; 524/439; 524/401; 524/437; 523/457; 523/459
[58] Field of Search ............ 252/512, 514, 518; 106/1.13, 1.14, 1.18, 1.19; 524/401, 437, 439–441, 430; 525/107, 119, 122; 523/457–459

[56] References Cited

U.S. PATENT DOCUMENTS 4,369,068  1/1983  Hausselt et al. ............... 252/514
4,410,457 10/1983  Fuyumura et al. ............. 252/514
4,496,475  1/1985  Abrams ........................ 106/1.14
4,575,432  3/1986  Lin et al. ..................... 524/439
4,581,158  4/1986  Lin ............................. 252/512
4,595,604  6/1986  Martin et al. ................. 252/514

Primary Examiner—Josephine Barr
Attorney, Agent, or Firm—Frishauf, Holtz, Goodman & Woodward

[57] ABSTRACT

An electroconductive resin paste, comprising a resin obtained by reacting 0.01 to 0.5 carboxylic acid equivalent of a homopolymer or a copolymer of butadiene having carboxylic acid terminal groups with 1 epoxy equivalent of an epoxy resin having two or more epoxy groups in one molecule, a curing agent and an electroconductive filler which is (i) an electroconductive metal powder or (ii) an inorganic insulating powder coated with a surface electroconductive film, said electroconductive filler being in an amount of from 60 to 95% by weight based on the resin and the electroconductive filler.

13 Claims, No Drawings

ELECTROCONDUCTIVE RESIN PASTE

BACKGROUND OF THE INVENTION

This invention relates to an electroconductive resin paste.

In the prior art, as the chip mount material onto a lead frame of IC, LSI, etc., there have been generally known the Au-Si eutectic alloy method, the solder method and the electroconductive resin paste method. However, the Au-Si eutectic alloy method is high in cost and there was involved the drawback that chip crack was generated when applied for a large scale chip. On the other hand, according to the solder method, for imparting soldering capability to IC chip, it is required to attach a film of Au on the back of the IC chip, whereby the cost is increased. Further, due to low melting point, there is the drawback that it is not applicable for a wire bonding device according to the thermal compression method (TC method) for which heating at 350° C. is required. As compared with these methods, the electroconductive resin paste method is excellent in workability, reliability, heat-resistant adhesiveness, and it is also low in cost. Therefore, demand for this method is now increasing rapidly.

However, when a large scale chip such as memory is bonded and cured onto a copper lead frame with a large coefficient of thermal expansion (a) by use of this electroconductive resin paste, due to thermal stress created through the difference in between the chip and the lead frame, chip crack or chip warping is generated, whereby there has been involved the problem that yield in the assembling step or reliability of the device may be damaged.

The present invention is intended to remove the drawback of the electroconductive resin paste of the prior art as mentioned above and provide an electroconductive resin paste of high reliability without generation of chip crack even in a large scale chip.

SUMMARY OF THE INVENTION

The present invention concerns an electroconductive resin paste, comprising a resin obtained by reacting 0.01 to 0.5 carboxylic acid equivalent of a homopolymer or a copolymer of butadiene having carboxylic acid terminal groups with 1 epoxy equivalent of an epoxy resin having two or more epoxy groups in one molecule, a curing agent and an electroconductive filler.

In the present invention, an epoxy resin having two or more epoxy groups in one molecule is used. Such epoxy resin is not particularly limited, but may include condensation products of bisphenol A, AD, S, F or a halogenated bisphenol A with epichlorohydrin, such as Epikote 828, 1001, 1004 and 1007 (trade names, all produced by Shell Chemical Co.), YDF-170 and YDB-340 (trade names, all produced by Toto Kasei Co.), R-710 (trade name, produced by Mitsui Sekiyu Kagaku Co.); glycigyl ether of phenol novolac resin, glycidyl ether of cresol novolac resin, such as DEN-438 (trade name, produced by Dow Chemical Co.), ECN-1273 (trade name, produced by Ciba-Geigy Co.) and YDCN-701 (trade name, produced by Toto Kasei Co.); etc.

With one epoxy equivalent of the epoxy resin is reacted 0.01 to 0.5 carboxylic acid equivalent of a homopolymer or a copolymer of butadiene having carboxylic acid terminal groups. With less than 0.01 carboxylic acid equivalent, no effect can be obtained, while an excess of 0.5 carboxylic acid equivalent will result in inferior curability of the epoxy resin, whereby heat resistance is worsened.

Examples of the homopolymer or copolymer of butadiene having carboxylic acid terminal groups used here may include Hycar CTB-2000×162, CTBN-1300×31 and CTBNX-1300×9 (trade names, all produced by Ube Kosan K.K.), NISSO-PB-C-2000 (trade names, produced by Nippon Soda K.K.), etc.

The reaction of these butadiene homopolymers or copolymers with the above epoxy resin may be carried out without catalyst or with the use of a catalyst e.g. a tertiary amine such as N,N-dimethylbenzylamine, triphenylphosphine, etc., by heating at 80° to 160° C. for 0.5 to 5 hours, ordinarily in the presence of a solvent used for the electroconductive resin paste, if desired. The solvent may be used for making handling easier by lowering the viscosity during the reaction.

In the electroconductive resin paste, for improvement of workability, a solvent may be used, if desired. As such solvent, those having good dissolving characteristic for the above resin, and also those having a boiling point of 100° C. or higher are preferred for coating workability, and examples thereof include organic solvents such as ethylcellosolve, butylcellosolve, cellosolve acetate, butylcellosolve acetate, ethylcarbitol, butylcarbitol, ethylcarbitol acetate, α-terpineol and the like. Also, for the electroconductive resin paste, a reactive diluent having 1 to 2 epoxy groups in one molecule such as phenyl glycidyl ether, p-(t-butyl)phenyl glycidyl ether, butyl glycidyl ether, butanediol glycidyl ether, neopentylglycol diglycidyl ether, vinylcyclohexenedioxide, γ-glycidoxypropyl trimethoxysilane, p-(t-butyl)benzoic acid glycidyl ester, etc. may be used.

As the curing agent to be used in the present invention, phenolic resin such as PS-2607, PS-2780, PSF-2807 and PS-2105 (trade names, all produced by Gunei Kagaku K.K.); an imidazole such as Curesol 2E4MZ-CN, 2P4MZ, 2PHZ, 2E4MZ-AZINE and 2MZ-OK (trade names, all produced by Shikoku Kasei K.K.); dicyandiamide and dicarboxylic acid dihydrazide, such as adipic dihydrazide and phthalic dihydrazide (produced by Nippon Hydrazine K.K.) are useful. The amount of the curing agent may be an amount which can cure the above resin and is not particularly limited. Further, for enhancing curability, a curing accelerator such as an imidazole, a tertiary amine, for example, N,N-dimethylbenzylamine, etc. may also be used in combination.

The electroconductive filler to be used in the present invention may be electroconductive metal powder such as silver powder, gold powder and copper powder and inorganic insulating powder such as alumina powder, glass powder, etc. coated with a surface electroconductive film, but silver powder is preferred in aspects of oxidation resistance, cost, electroconductivity, thermal conductivity. The electroconductive filler may be used in an amount within the range from 60 to 95% by weight based on the above resin and electroconductive filler.

Also, an adhesive force enhancer such as silane coupling agent, titanium type coupling agent, etc., a wettability enhancer such as nonionic surfactant, fluorine type surfactant, etc., a defoaming agent such as silicone oil, etc. can be also added properly in the electroconductive resin paste of the present invention.

As the steps for preparing the electroconductive resin paste by use of the materials as described above, for example, a resin obtained by the reaction between an epoxy resin having 2 or more epoxy groups in one molecule and a homopolymer or copolymer of butadiene having carboxylic acid terminal groups, a curing agent and a curing promoter and a solvent, both of them are optionally employed, are mixed or dissolved in predetermined amounts. In this case, kneading or dissolving may be performed by using properly dispersing machines such as conventional stirrer, grinder, three rolls, ball mill, etc. in combination.

Next, a predetermined amount of an electroconductive filler is further mixed with the above mixture and, also in this case, kneading may be performed by using properly a combination of dispersing machines such as stirrer, grinder, three rolls, ball mill, etc. to prepare an electroconductive resin paste.

The steps for preparing the electroconductive resin paste are not limited to those as described above.

The electroconductive resin paste according to the present invention is not only suitable for chip mount material for IC and LSI but also for formation of electrodes for a tantalum condensor, etc.

The present invention is described below by referring to Examples, in which parts mean parts by weight.

EXAMPLE 1

To 100 parts of an epoxy resin YDF-170 (epoxy equivalent: 170) were added 40 parts of Hycar CTBNX-1300×9 (carboxylic acid equivalent: 1500) and 0.01 part of N,N-dimethylbenzylamine, and the mixture was heated under stirring at 120° C. for 60 minutes to obtain a modified epoxy resin. To 50 parts of the modified epoxy resin were added 4 parts of dicyandiamide, 0.5 parts of Curesol 2PHZ and 60 parts of butylcellosolve acetate, and the mixture was kneaded by means of a grinder, and 290 parts of silver powder TCG-1 (trade name, produced by Tokuriki Kagaku) were added to the mixture, followed by kneading by a grinder to obain an electroconductive paste. The paste thus obtained was coated on 42 Alloy lead frame and copper lead frame and, with a silicon chip of 4×9 mm placed thereon, bonding was effected by heating at 150° C. for one hour. As a result, no generation of chip crack was observed and good results were obtained with little chip warping. Table 1 shows the evaluation results.

EXAMPLE 2

To 100 parts of an epoxy resin Epikote-1004 (epoxy equivalent: 900) were added 50 parts of Hycar CTBNX-1300×9, 100 parts of butylcellosolve acetate and further 0.01 part of triphenylphosphine, and the mixture was heated under stirring at 120° C. for 30 minutes. To 80 parts of the modified epoxy resin thus obtained, 54 parts of a solution dissolved by heating under stirring 4 parts of a phenol resin PS 2607 (OH equivalent: 110) and 50 parts of butylcellosolve acetate were added, and further 1 part of Curesol 2PHZ was added and the mixture was kneaded by means of a grinder. Further( 310 parts of silver powder TCG-1 were added and the mixture was kneaded by a grinder to obtain an electroconductive resin paste. By use of the thus obtained electroconductive resin paste, evaluation was conducted in the same manner as in Example 1. Table 1 shows the evaluation results.

EXAMPLE 3

To 100 parts of an epoxy resin DEN-438 (epoxy equivalent: 180) were added 40 parts of Hycar CTB-2000×162 (carboxylic acid equivalent: 2400) and the mixture was heated under stirring at 160° C. for 5 hours. Further, the mixture was cooled to 50° C., and 210 parts of phenyl glycidiyl ether were added, followed by heating under stirring at 80° C. for 30 minutes, to obtain a modified epoxy resin solution. To 125 parts of the modified epoxy resin solution thus obtained were added 4 parts of dicyandiamide and 0.1 part of Curesol 2P4MZ, followed by mixing under stirring. Further, with addition of 300 parts of silver powder TCG-1, the mixture was stirred until uniform, whereupon the mixture was kneaded on three rolls to obtain an electroconductive paste. By use of the electrodoncutive paste thus obtained, evaluation was conducted in the same manner as in Example 1. Table 1 shows the evaluation results.

COMPARATIVE EXAMPLE

To a solution prepared by dissolving 50 parts of an epoxy resin Epikote-828 (epoxy equivalent: 195), 25 parts of a phenol resin PS 2607 and 70 parts of butylcellosolve acetate under heating and stirring at 120° C. for one hour was added 1 part of Curesol 2PHZ, and the mixture was kneaded by means of a grinder. Further, the mixture was kneaded with addition of 340 parts of silver powder TCG-1 to obtain an electroconductive resin paste. By use of the electroconductive resin thus obtained, evaluation was conducted in the same manner as in Examples. Table 1 shows the evaluation results. The bonded state was good on the 42 Alloy lead frame, but cracks generated on a part of the copper lead frame. Also, chip warping exhibited greater values in any case as compared with Examples 1 to 3.

TABLE 1

| | Example 1 | Example 2 | Example 3 | Comparative example |
|---|---|---|---|---|
| Viscosity (PS, 25° C.) | 350 | 400 | 500 | 400 |
| Curing Conditions | 150° C., 1 hour | 180° C., 1 hour | 150° C., 1 hour | 180° C., 1 hour |
| Bonded state (appearance): | | | | |
| 42 Alloy lead frame | Good | Good | Good | Good |
| Copper lead frame | Good | Good | Good | Partial crack generation |
| Chip warping ($\mu$m/9 mm): | | | | |
| 42 Alloy lead frame | 1 | 0.5 | 1 | 5 |
| Copper lead frame | 15 | 10 | 10 | 55 |
| Adhesive strength (kg/cm$^2$): | | | | |
| room temperature | 150 | 75 | 150 | 80 |
| 350° C. | 15 | 18 | 20 | 17 |
| Volume Resistivity (ohm · cm) | $2 \times 10^{-4}$ | $5 \times 10^{-4}$ | $1.5 \times 10^{-3}$ | $3 \times 10^{-4}$ |

By use of the electroconductive resin paste of the present invention, when a large scale chip such as IC and LSI memory is bonded onto a copper lead frame, thermal stress applied between the chip and the lead frame can be absorbed, whereby no chip crack will be generated, and production of IC and LSI can be practiced at low cost, high productivity and yet with high reliability.

We claim:

1. An electroconductive resin paste, comprising a resin obtained by reacting 0.01 to 0.5 carboxylic acid equivalent of a homopolymer or a copolymer of butadiene having carboxylic acid terminal groups with 1 epoxy equivalent of an epoxy resin having two or more epoxy groups in one molecule, a curing agent and an electroconductive filler which is (i) an electroconductive metal powder or (ii) an inorganic insulating powder coated with a surface electroconductive film, said electroconductive filler being in an amount of from 60 to 95% by weight based on the resin and the electroconductive filler.

2. The electroconductive resin paste according to claim 1, wherein the electroconductive filler is silver powder, gold powder, copper powder, alumina powder coated with a surface electroconductive film, or glass powder coated with a surface electroconductive film.

3. The electroconductive resin paste according to claim 2, wherein the electroconductive filler is silver powder.

4. The electroconductive resin paste according to claim 1, wherein said curing agent is a phenolic resin, an imidazole, a dicyanidiamide or a dicarboxylic acid dihydrazide.

5. The electroconductive resin paste according to claim 1, wherein further comprises a curing accelerator.

6. The electroconductive resin paste according to claim 5, which said curing a accelerator is an imidazole or a tertiary amine.

7. The electroconductive resin paste according to claim 2, wherein said curing agent is a phenolic resin, an imidazole, a dicyandiamide or a dicarboxylic acid dehydrazide.

8. The electroconductive resin paste according to claim 7, which further comprises a curing accelerator.

9. The electroconductive resin paste according to claim 2, which further comprises a curing accelerator.

10. The electroconductive resin paste according to claim 4, wherein said curing accelerator is an imidazole or a tertiary amine.

11. The electroconductive resin paste according to claim 10, wherein the electroconductive filler is silver powder.

12. The electroconductive resin paste according to claim 8, wherein the electroconductive filler is silver powder.

13. The electroconductive resin paste according to claim 4, wherein the electroconductive filler is silver powder.

* * * * *